US012765138B2

(12) United States Patent
Li et al.

(10) Patent No.: US 12,765,138 B2
(45) Date of Patent: Oct. 13, 2026

(54) DISPLAY APPARATUS

(71) Applicant: AUO Corporation, Hsin-Chu (TW)

(72) Inventors: Chun-Chieh Li, Hsin-Chu (TW); Sheng-Ming Huang, Hsin-Chu (TW); Han-Sheng Nian, Hsin-Chu (TW); Yu-Cheng Shih, Hsin-Chu (TW); Hsin-Hung Li, Hsin-Chu (TW)

(73) Assignee: AUO CORPORATION, Hsin-Chu (TW)

(*) Notice: Subject to any disclaimer, the term of this patent is extended or adjusted under 35 U.S.C. 154(b) by 400 days.

(21) Appl. No.: 18/397,556

(22) Filed: Dec. 27, 2023

(65) Prior Publication Data

US 2025/0063866 A1 Feb. 20, 2025

(30) Foreign Application Priority Data

Aug. 15, 2023 (TW) ................................ 112130606

(51) Int. Cl.

| | |
|---|---|
| ***H10H 20/855*** | (2025.01) |
| ***H10H 20/82*** | (2025.01) |
| ***H10W 90/00*** | (2026.01) |

(52) U.S. Cl.

CPC .......... *H10H 20/855* (2025.01); *H10H 20/82* (2025.01); *H10W 90/00* (2026.01)

(58) Field of Classification Search

CPC ...... H10H 20/855; H10H 20/82; H10W 90/00

See application file for complete search history.

(56) References Cited

U.S. PATENT DOCUMENTS

| | | | | |
|---|---|---|---|---|
| 2017/0133357 | A1* | 5/2017 | Kuo | H10H 20/856 |
| 2017/0141167 | A1* | 5/2017 | Naganuma | H10K 59/131 |
| 2021/0335966 | A1* | 10/2021 | Li | H10K 59/122 |
| 2021/0408103 | A1 | 12/2021 | Dai et al. | |
| 2022/0367581 | A1* | 11/2022 | Wang | H10K 59/80515 |
| 2024/0021656 | A1* | 1/2024 | Mezouari | H10H 29/142 |

FOREIGN PATENT DOCUMENTS

| | | | | |
|---|---|---|---|---|
| CN | 111627345 | A | 9/2020 | |
| CN | 114649387 | A * | 6/2022 | H10K 59/8792 |
| CN | 114665047 | A | 6/2022 | |
| CN | 114759058 | A | 7/2022 | |
| GB | 2601495 | B | 2/2023 | |
| KR | 20220056284 | A * | 5/2022 | H10K 50/868 |

* cited by examiner

*Primary Examiner* — Jeff W Natalini
*Assistant Examiner* — Rose Keagy
(74) *Attorney, Agent, or Firm* — Tim Tingkang Xia, Esq.; Troutman Pepper Locke LLP

(57) ABSTRACT

A display apparatus includes a driving backplane, a plurality of light emitting components, a first bank layer and a plurality of scattering particles. The first bank layer is disposed on the driving backplane. The first bank layer has a plurality of first openings and a plurality of oblique surfaces defining the first openings. The light emitting components respectively overlap with the first openings of the first bank layer. The scattering particles are disposed on a plurality of light emitting surfaces of the light emitting components. A plurality of air gaps exist between the scattering particles and the oblique surfaces of the first bank layer.

20 Claims, 13 Drawing Sheets

DISPLAY APPARATUS

CROSS-REFERENCE TO RELATED PATENT APPLICATION

This non-provisional application claims priority to and the benefit of, pursuant to 35 U.S.C. § 119(a), patent application Serial No. 112130606 filed in Taiwan on Aug. 15, 2023. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to an optoelectronic apparatus, and particularly to a display apparatus.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A light emitting diode (LED) display panel includes a driving backplane and a plurality of LED components transposed on the driving backplane. Inheriting the characteristics of the LED, the LED display panel has the advantages such as saving power, high efficiency, high brightness and fast response time. In addition, compared to the organic LED (OLED) display panel, the LED display panel further has the advantages such as easy color adjustment, long luminous life and no image burn-in. Thus, the LED display panel are considered the next generation of display technology.

The LED display panel has a wide variety of application fields. For example, the LED display panel may serve as an image source for an augmented reality (AR) display apparatus, in which the image light beams output by the LED display panel may pass the projection lens to further present the image in front of the viewer's eyes. However, generally, the light emitting angle of the LED display panel is larger than a light collection angle of the projection lens. In other words, the image light beams emitted by the LED display panel cannot be fully utilized, resulting in insufficient brightness of the image for the AR display apparatus. Therefore, one of the challenges faced by the researchers is to develop a LED display panel with a small light emitting angle.

SUMMARY

The present disclosure provides a display apparatus with a small light emitting angle.

The display apparatus according to certain embodiments of the present disclosure includes a driving backplane, a plurality of light emitting components, a first bank layer and a plurality of scattering particles. The light emitting components are disposed on the driving backplane, and are electrically connected to the driving backplane. The first bank layer is disposed on the driving backplane. The first bank layer has a plurality of first openings and a plurality of oblique surfaces defining the first openings. The light emitting components respectively overlap with the first openings of the first bank layer, and the oblique surfaces of the first bank layer are oblique relative to the driving backplane. The scattering particles are disposed on a plurality of light emitting surfaces of the light emitting components. A plurality of air gaps exist between the scattering particles and the oblique surfaces of the first bank layer.

In one embodiment of the present disclosure, a refractive index of one of the scattering particles is between a refractive index of one of the air gaps and a refractive index of one of the light emitting components.

In one embodiment of the present disclosure, a refractive index of one of the scattering particles falls within a range between 1.5 and 2.

In one embodiment of the present disclosure, a body of the first bank layer has a height in a first direction perpendicular to the driving backplane, the body of the first bank layer has a maximum width in a second direction parallel to the driving backplane, and a ratio of the height to the width is less than or equal to 6.

In one embodiment of the present disclosure, the light emitting components are arranged at an interval in the second direction, and a width of each of the first openings is less than or equal to the interval.

In one embodiment of the present disclosure, the light emitting surfaces of the light emitting components respectively include a plurality of rough surfaces, and each of the rough surfaces is provided with a portion of the scattering particles.

In one embodiment of the present disclosure, the display apparatus further includes a lens component disposed on the first bank layer. The scattering particles, the oblique surfaces of the first bank layer and the lens component surroundingly form the air gaps.

In one embodiment of the present disclosure, the display apparatus further includes a second bank layer disposed between the first bank layer and the driving backplane. The second bank layer has a plurality of second openings. The second openings of the second bank layer respectively overlap with the first openings of the first bank layer. The light emitting components and the scattering particles are disposed in the second openings of the second bank layer.

These and other aspects of the present disclosure will become apparent from the following description of the embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
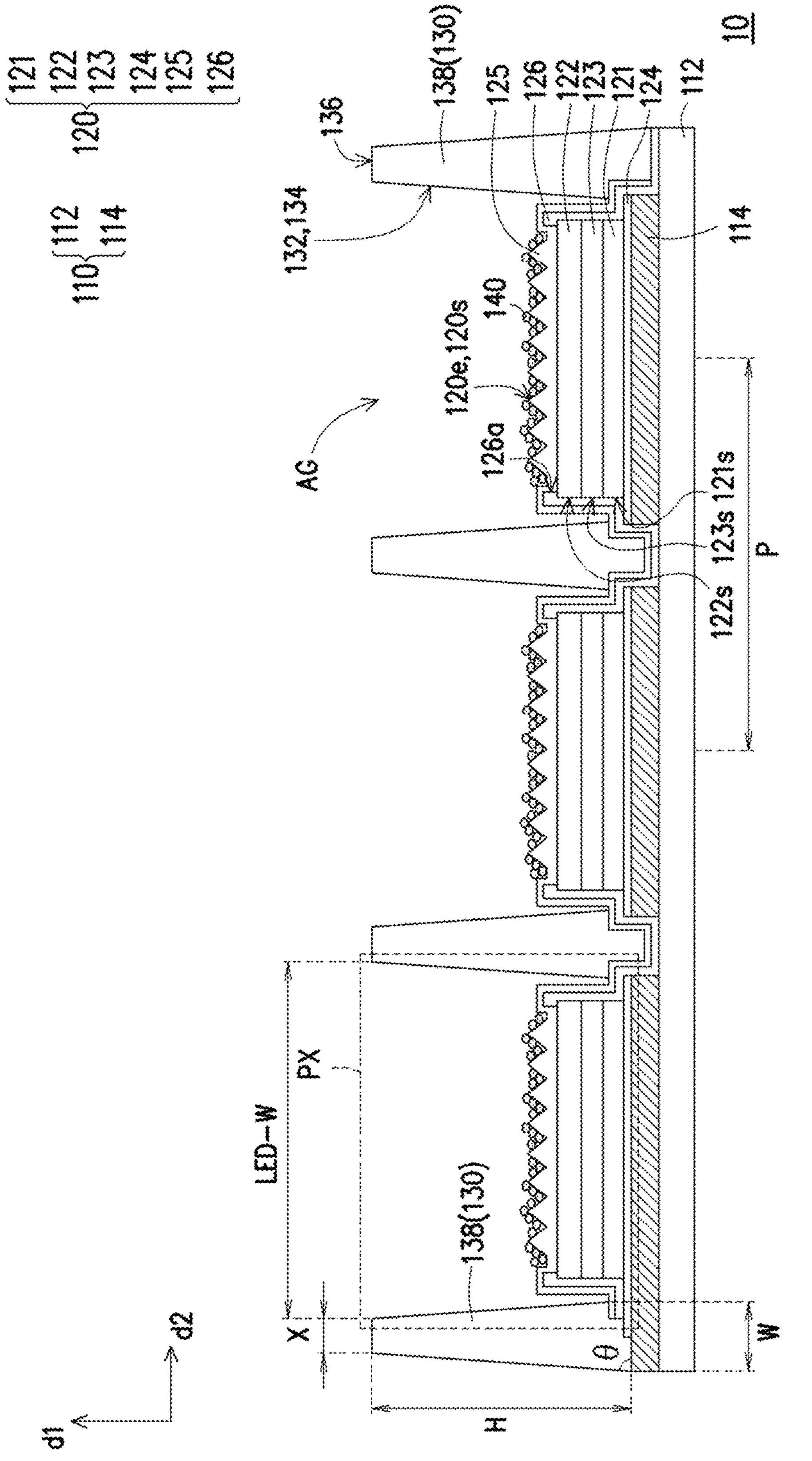
FIG. 1 is a sectional schematic view of a display apparatus according to a first embodiment of the present disclosure.

The present disclosure will now be described hereinafter in details with reference to the accompanying drawings, in which exemplary embodiments of the disclosure are shown. Whenever possible, identical reference numerals refer to identical or like elements in the drawings and descriptions.

It should be understood that when one component such as a layer, a film, a region or a substrate is referred to as being disposed "on" the other component or "connected to" the other component, the component may be directly disposed on the other component or connected to the other component, or an intermediate component may also exist between the two components. In contrast, when one component is referred to as being "directly disposed on the other component" or "directly connected to" the other component, no intermediate component exists therebetween. As used herein, a "connection" may be a physical and/or electrical connection. In addition, when two components are "electrically connected" or "coupled", other components may exist between the two components.

The terms "about", "approximately" or "substantially" as used herein shall cover the values described, and cover an average value of an acceptable deviation range of the specific values ascertained by one of ordinary skill in the art, where the deviation range may be determined by the measurement described and specific quantities of errors related to the measurement (that is, the limitations of the measuring system). For example, the term "about" represents within one or more standard deviations of a given value of range, such as within ±30 percent, within ±20 percent, within +10 percent or within +5 percent. Moreover, the terms "about", "approximately" or "substantially" as used herein may selectively refer to a more acceptable deviation range or the standard deviation based on the optical characteristics, the etching characteristic or other characteristics, without applying one standard deviation to all characteristics.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a sectional schematic view of a display apparatus according to a first embodiment of the present disclosure. Referring to FIG. 1, the display apparatus 10 includes a driving backplane 110. The driving backplane 110 includes a driving substrate 112 and a plurality of pads 114. The driving substrate 112 has a plurality of pixel driving circuits (not illustrated), and the pads 114 are electrically connected to the pixel driving circuits respectively. For example, in the present embodiment, the driving substrate 112 may include a complementary metal-oxide-silicon (CMOS), and the pads 114 may include metal, but the present disclosure is not limited thereto.

The display apparatus 10 further includes a plurality of light emitting components 120, disposed on the driving backplane 110, and electrically connected to the driving backplane 110. In the present embodiment, each light emitting component 120 may include a first type semiconductor layer 121, a second type semiconductor layer 122, an active layer 123 disposed between the first type semiconductor layer 121 and the second type semiconductor layer 122, a first electrode 124 electrically connected to the first type semiconductor layer 121 and a second electrode 125 electrically connected to the second type semiconductor layer 122. The first electrode 124 is electrically connected to a corresponding pad 114. For example, in the present embodiment, the first electrode 124, the first type semiconductor layer 121, the active layer 123, the second type semiconductor layer 122 and the second electrode 125 may be stacked sequentially in a first direction d1 perpendicular to the driving backplane 110. In other words, in the present embodiment, each light emitting component 120 may be a vertical LED. However, the present disclosure is not limited thereto, and according to other embodiments, each light emitting component 120 may be a lateral LED or other types of LEDs. In the present embodiment, the first electrode 124 and the second electrode 125 of each light emitting component 120 may be both transparent electrodes, but the present disclosure is not limited thereto.

In the present embodiment, each light emitting component 120 may further include an insulating protection layer 126, and the insulating protection layer 126 covers a side wall 121*s* of the first type semiconductor layer 121, a side wall 122*s* of the second type semiconductor layer 122 and a side wall 123*s* of the active layer 12. The insulating protection layer 126 has an opening 126*a* overlapping with the second type semiconductor layer 122, and the second electrode 125 may be filled into the opening 126*a* of the insulating protection layer 126 to be electrically connected to the second type semiconductor layer 122. In the present embodiment, the active layer 123 may optionally include a multiple quantum well structure, but the present disclosure is not limited thereto.

In the present embodiment, the light emitting surface 120*e* of each light emitting component 120 may optionally include a rough surface 120*s* to increase the light emitting efficiency. For example, in the present embodiment, the second electrode 125 itself may have a structure of an uneven thickness to form the rough surface 120*s*. However, the present disclosure is not limited thereto, and according to other embodiments, other methods and/or other film layers of each light emitting component 120 may be used to form the rough surface 120*s*.

The display apparatus 10 further include a first bank layer 130, disposed on the driving backplane 110. The first bank layer 130 has a plurality of first openings 132 and a plurality of oblique surfaces 134 defining the first openings 132. The light emitting components 120 respectively overlap with the first openings 132 of the first bank layer 130. The oblique surfaces 134 of the first bank layer 130 are oblique relative to the driving backplane 110. The first bank layer 130 further has a top surface 136 facing away from the driving backplane 110. In the present embodiment, the top surface 136 of the first bank layer 130 may be a flat surface, thus forming a shoulder portion. The top surface 136 of the first bank layer 130 has a width X in a second direction d2 parallel to the driving backplane 110, each first opening 132 of the first bank layer 130 has a width LED-W in the second direction d2, and 0<X≤LED-W. In the present embodiment, an angle θ exists between each oblique surface 134 of the first bank layer 130 and the second direction d2 parallel to the driving backplane 110, and 0°<θ<90°. In other words, $$\tan\theta = \frac{2H}{W - X},$$

$$0° < \tan^{-1}\left(\frac{2H}{W - X}\right) < 90°,$$

where H is a height H of the body 138 of the first bank layer 130 in the first direction d1 perpendicular to the driving backplane 110, W is a maximum width W of the body 138 of the first bank layer 130 in the second direction d2 parallel to the driving backplane 110, and X is a width of the top surface 136 of the first bank layer 130 in the second direction d2 parallel to the driving backplane 110. In the present embodiment, the first bank layer 130 may be optionally formed using an electroplating process, and the material of the first bank layer 130 may include a reflective conductive material, but the present disclosure is not limited thereto.

In the present embodiment, a body 138 of the first bank layer 130 has a height H in the first direction d1 perpendicular to the driving backplane 110, the body 138 of the first bank layer 130 has a maximum width W in the second direction d2 parallel to the driving backplane 110, and a ratio H/W of the height H to the width W is less than or equal to 6. Further, in the present embodiment, 0<(H/W)≤6. In the present embodiment, the light emitting components 120 are arranged at an interval P in the second direction d2, and a width LED-W of each first opening 132 of the first bank layer 130 in the second direction d2 is less than or equal to the interval P. In addition, in the present embodiment, the width LED-W of each first opening 132 of the first bank layer 130 is greater than or equal to the width W of the body 138 of the first bank layer 130.

It should be noted that the display apparatus 10 further include a plurality of scattering particles 140, disposed on a plurality of light emitting surfaces 120*e* of the light emitting components 120. A plurality of air gaps AG exist between the scattering particles 140 and the oblique surfaces 134 of the first bank layer 130. The light beams (not illustrated) emitted by the light emitting components 120 may be diffused by the scattering particles 140 and then reflected by the oblique surfaces 134 of the first bank layer 130, thus reducing the light emitting angle of each pixel PX of the display apparatus 10. Each pixel PX of the display apparatus 10 includes a light emitting component 120, the scattering particles 140 on the light emitting surfaces 120*e* of the light emitting component 120, an oblique surface 134 of the first bank layer 130 defining a first opening 132 and an air gap AG in the first opening 132.

In the present embodiment, the rough surface 120*s* of each light emitting component 120 is provided with the scattering particles 140. In the present embodiment, a refractive index of the scattering particles 140 is between a refractive index of the air gaps AG and a refractive index of the light emitting components 120. For example, in the present embodiment, the refractive index of the scattering particles 140 may fall within a range of 1.5 to 2, but the present disclosure is not limited thereto. In the present embodiment, each scattering particle 140 may include a plastic core (not illustrated) and a glue layer (not illustrated) distributed on the surface of the plastic core, and the scattering particles 140 may be fixed to the rough surface 120*s* by their glue layers.

Figure 2:
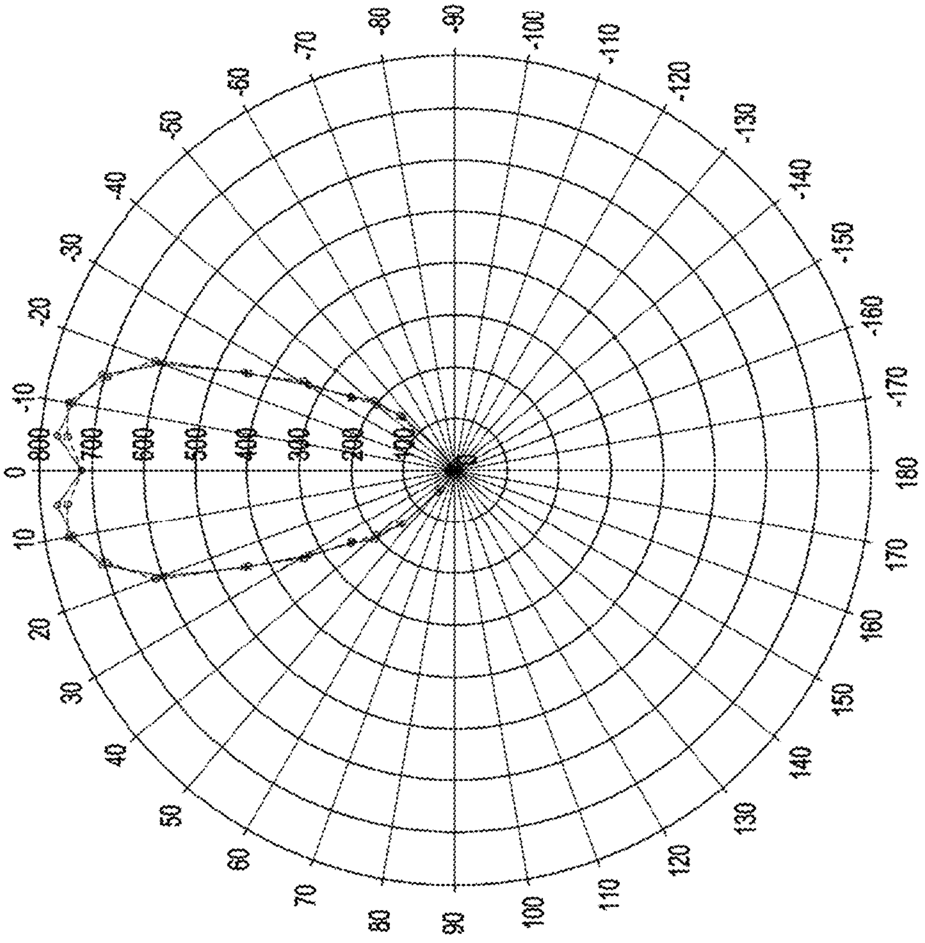
FIG. 2 shows a light emitting angle of a pixel of the display apparatus according to the first embodiment of the present disclosure.

FIG. 2 shows a light emitting angle of a pixel of the display apparatus according to the first embodiment of the present disclosure. Referring to FIG. 1 and FIG. 2, in the present embodiment, the light emitting angle of each pixel PX of the display apparatus 10 may be reduced to 57°.

Figure 3:
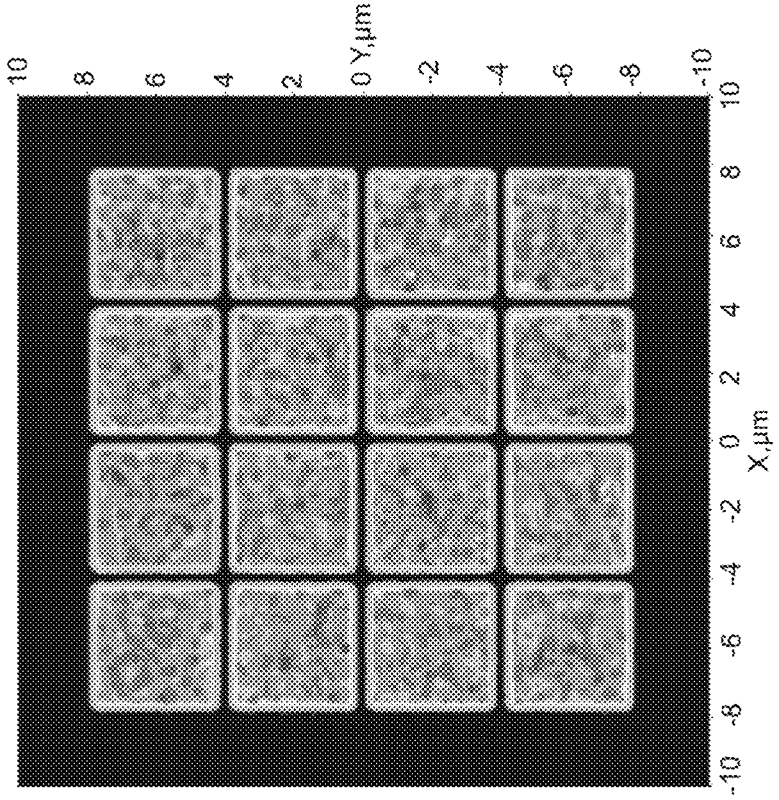
FIG. 3 shows light spots of a plurality of pixels of the display apparatus according to the first embodiment of the present disclosure.

FIG. 3 shows light spots of a plurality of pixels of the display apparatus according to the first embodiment of the present disclosure. Referring to FIG. 1 and FIG. 3, in the present embodiment, the contour of the light spot of each pixel PX of the display apparatus 10 is clear. In other words, the pixels PX are not prone to mix the light, and the display apparatus 10 has good display effect. For example, in the present embodiment, the display apparatus 10 may be applied in an augmented reality (AR) eye-worn device. However, the present disclosure is not limited thereto, and according to other embodiments, the display apparatus 10 may be applied to an in-vehicle display or other usage scenarios.

Figure 4:
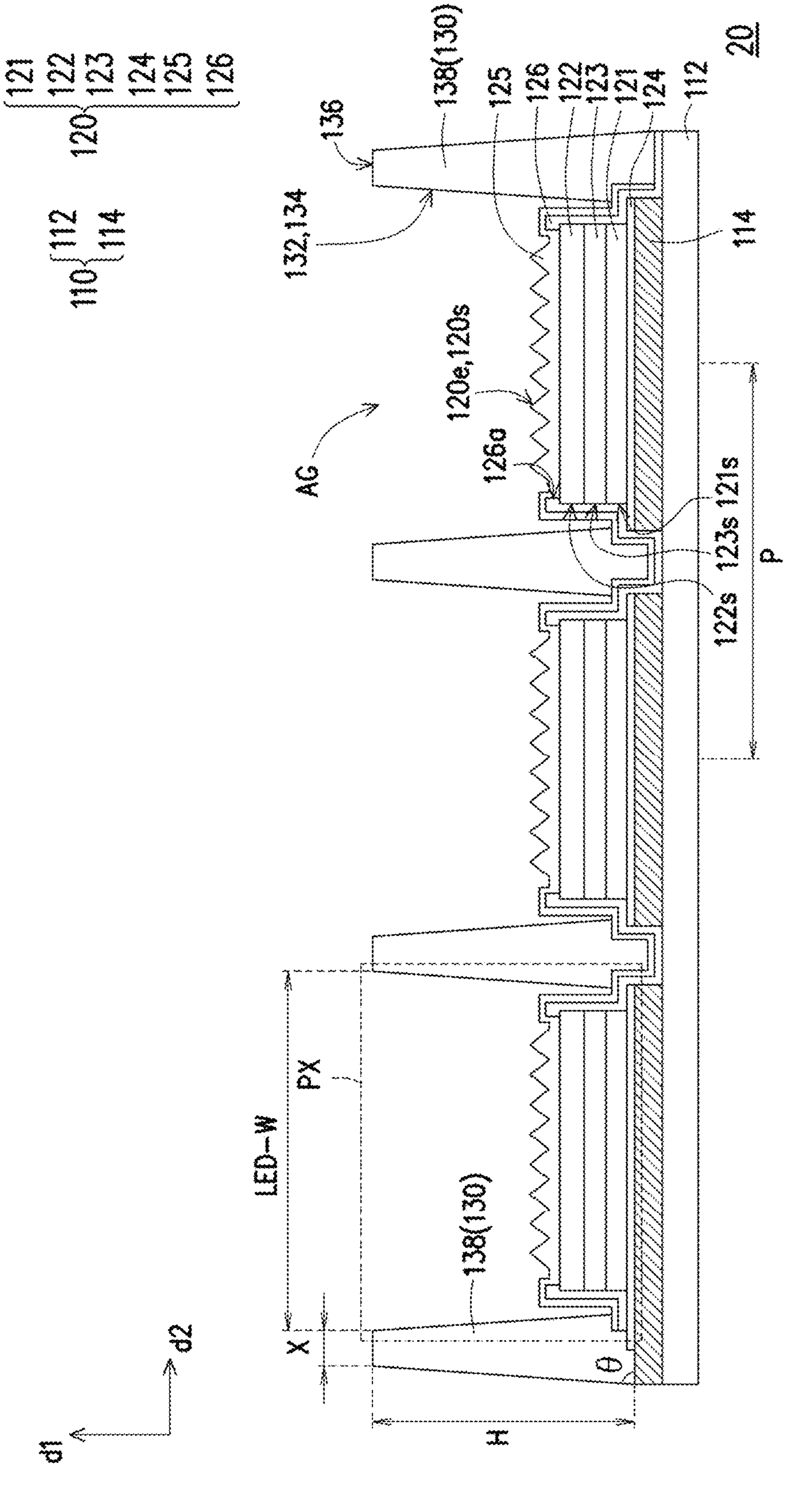
FIG. 4 is a sectional schematic view of a display apparatus according to a first comparative embodiment.

FIG. 4 is a sectional schematic view of a display apparatus according to a first comparative embodiment. The display apparatus 20 in the first comparative embodiment of FIG. 4 is similar to the display apparatus 10 in the first embodiment of FIG. 1, and the difference between the two exists in that the display apparatus 20 in the first comparative embodiment of FIG. 4 does not include the scattering particles 140 of FIG. 1.

Figure 5:
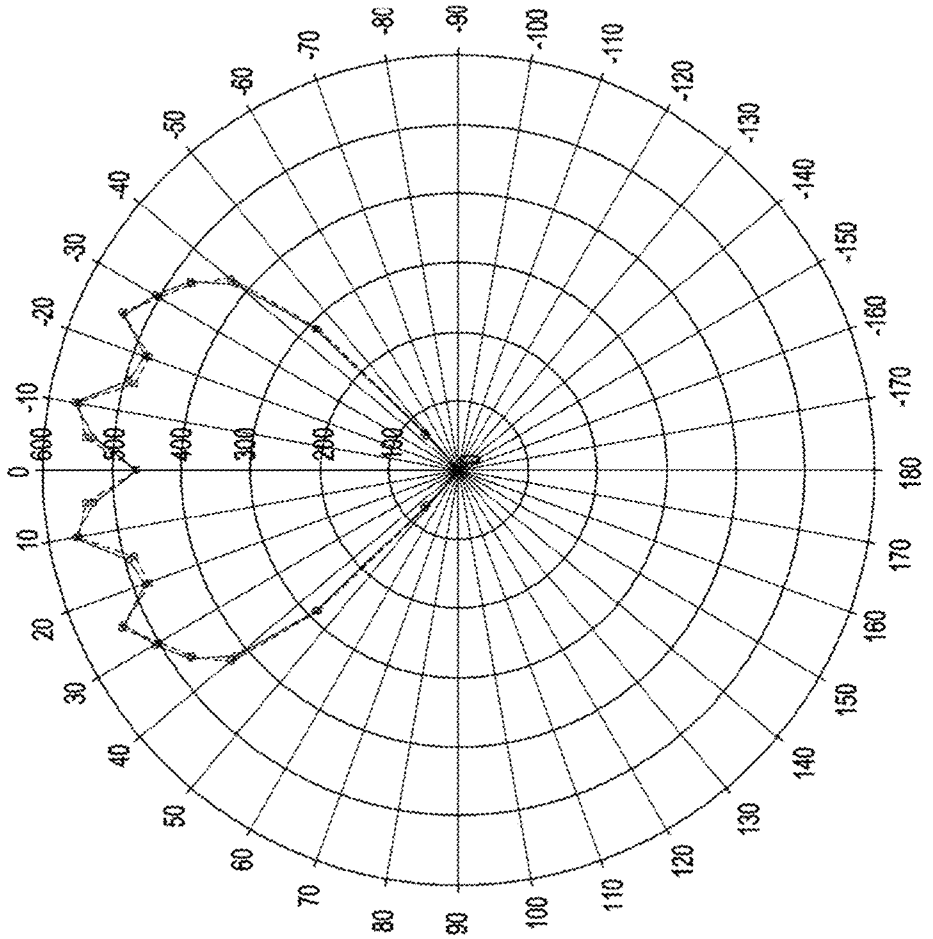
FIG. 5 shows a light emitting angle of a pixel of the display apparatus according to the first comparative embodiment.

FIG. 5 shows a light emitting angle of a pixel of the display apparatus according to the first comparative embodiment. Comparing FIG. 2 and FIG. 5, the display apparatus 10 in the first embodiment of FIG. 1 may significantly reduce the light emitting angle of each pixel PX by the matching of the scattering particles 140 and the oblique surface 134, for example, reducing from 90° of FIG. 5 to 570 of FIG. 2.

It should be noted that the following embodiments use the reference numerals and certain contents of the aforementioned embodiment, in which identical or similar components are identified by identical reference numerals, and descriptions of the identical technical contents will be omitted. The omitted descriptions may be referenced to in the aforementioned embodiment, and are not hereinafter reiterated in the following embodiments.

Figure 6:
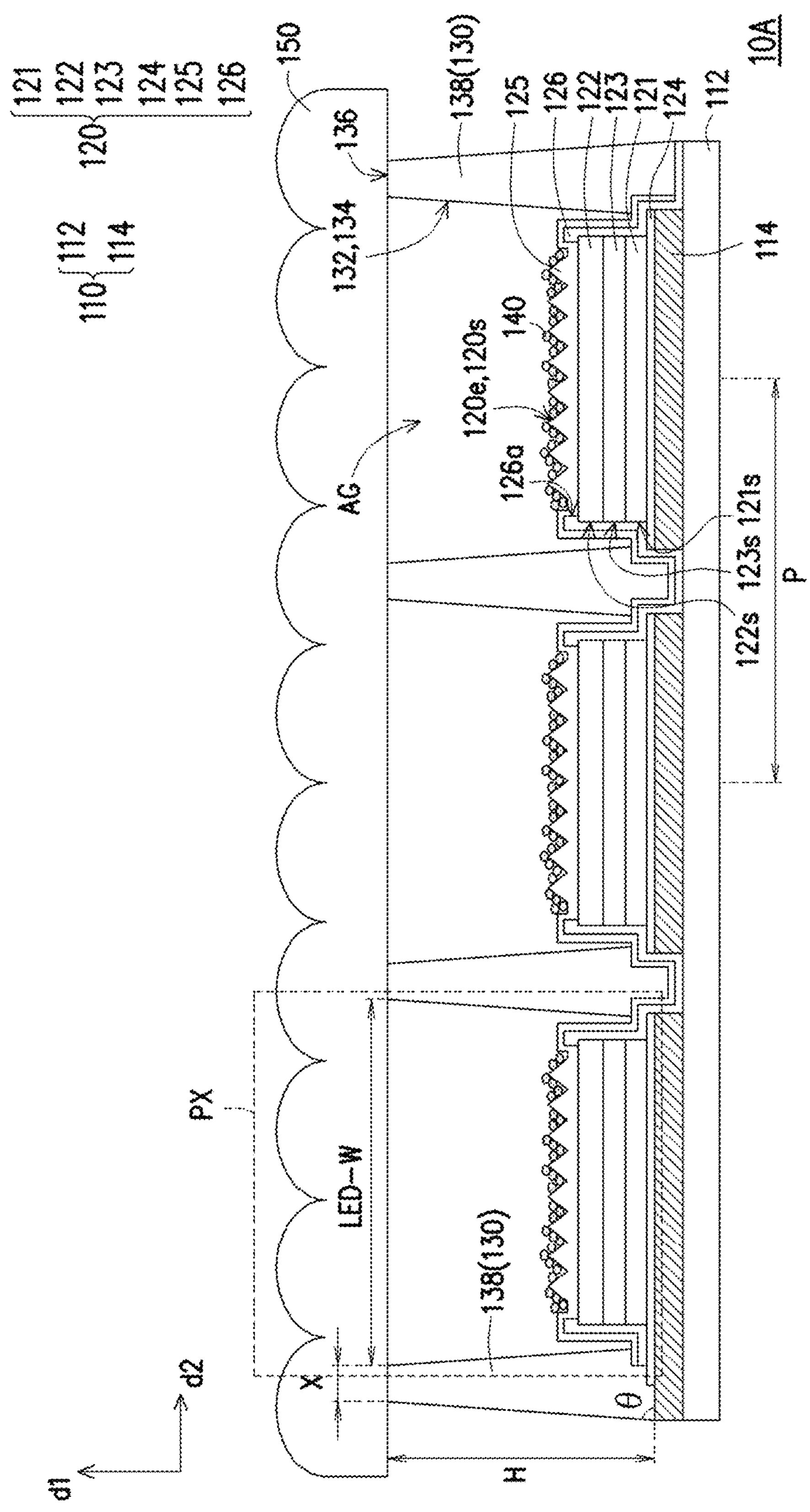
FIG. 6 is a sectional schematic view of a display apparatus according to a second embodiment of the present disclosure.
Figure 7:
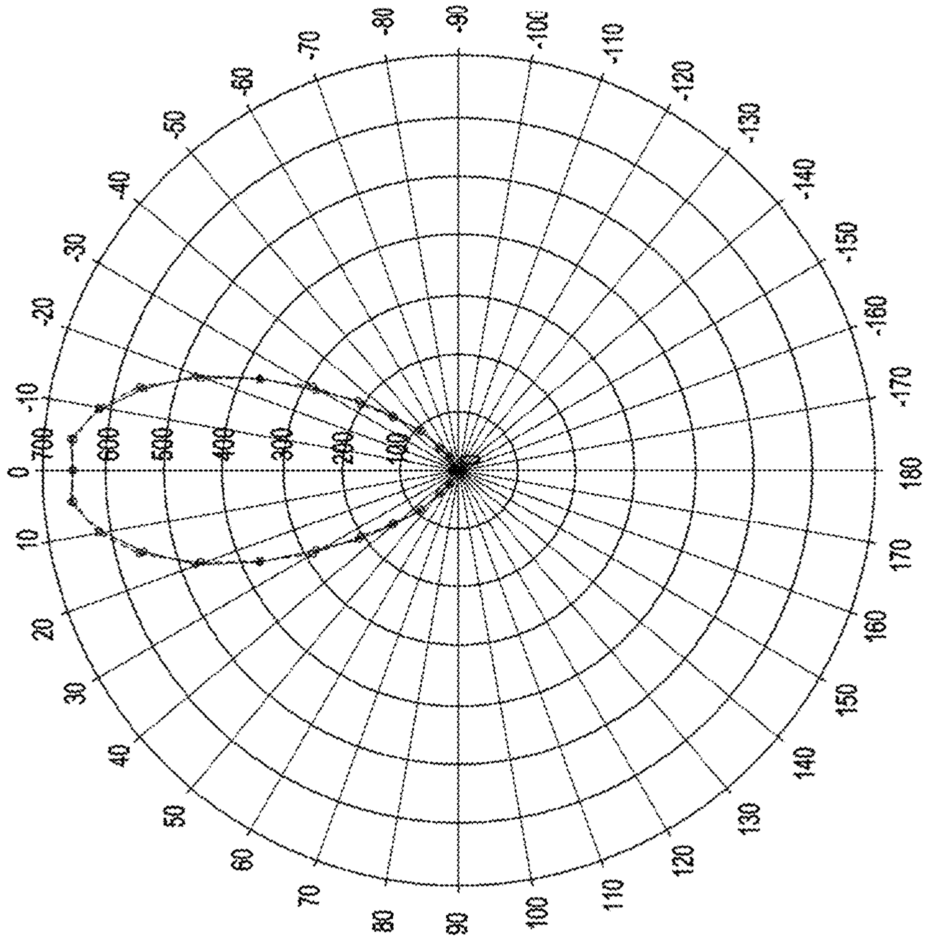
FIG. 7 shows a light emitting angle of a pixel of the display apparatus according to the second embodiment of the present disclosure.
Figure 8:
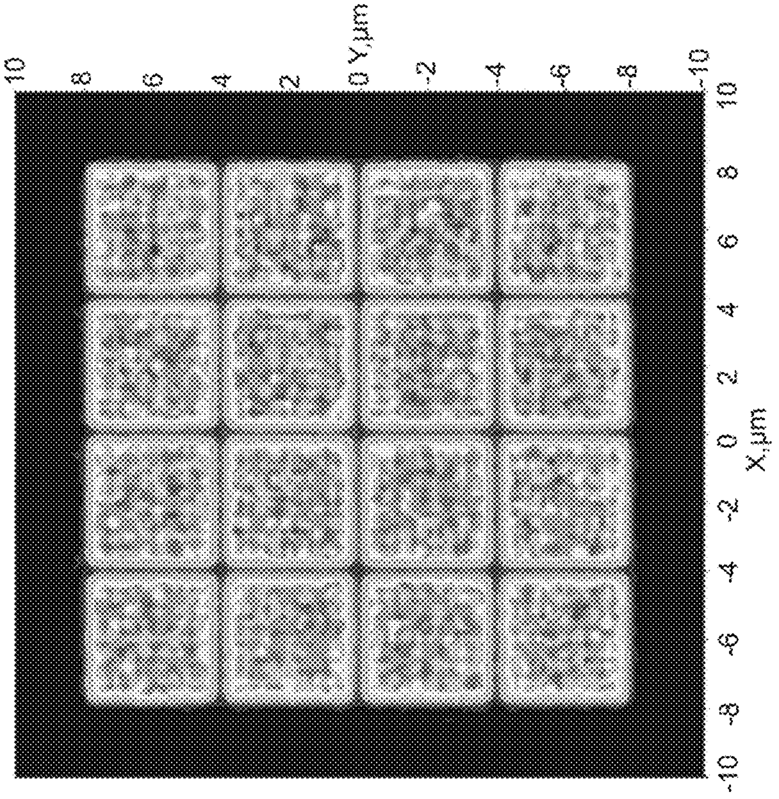
FIG. 8 shows light spots of a plurality of pixels of the display apparatus according to the second embodiment of the present disclosure.

FIG. 6 is a sectional schematic view of a display apparatus according to a second embodiment of the present disclosure. FIG. 7 shows a light emitting angle of a pixel of the display apparatus according to the second embodiment of the present disclosure. FIG. 8 shows light spots of a plurality of pixels of the display apparatus according to the second embodiment of the present disclosure. The display apparatus 10A in the second embodiment of FIG. 6 is similar to the display apparatus 10 in the first embodiment of FIG. 1, and the difference between the two exists in that the display apparatus 10A in the second embodiment of FIG. 6 further includes a lens component 150.

Referring to FIG. 6, in the present embodiment, the display apparatus 10A further includes a lens component 150, disposed on the first bank layer 130. The scattering particles 140, the oblique surfaces 134 of the first bank layer 130 and the lens component 150 surroundingly form the air gaps AG. In the present embodiment, the lens component 150 may be a micro-lens array or a lens array, but the present disclosure is not limited thereto.

In the present embodiment, each pixel PX of the display apparatus 10A includes a light emitting component 120, a plurality of scattering particles 140 on the light emitting surface 120*e* of the light emitting component 120, an oblique surface 134 of the first bank layer 130 defining a first opening 132, an air gap AG in the first opening 132 and a portion of the lens component 150 on the first opening 132.

The lens component 150 may be utilized to further reduce the light emitting angle of each pixel PX. Referring to FIG. 6 and FIG. 7, for example, in the present embodiment, the light emitting angle of each pixel PX of the display apparatus 10A may be reduced to 54°.

Figure 9:
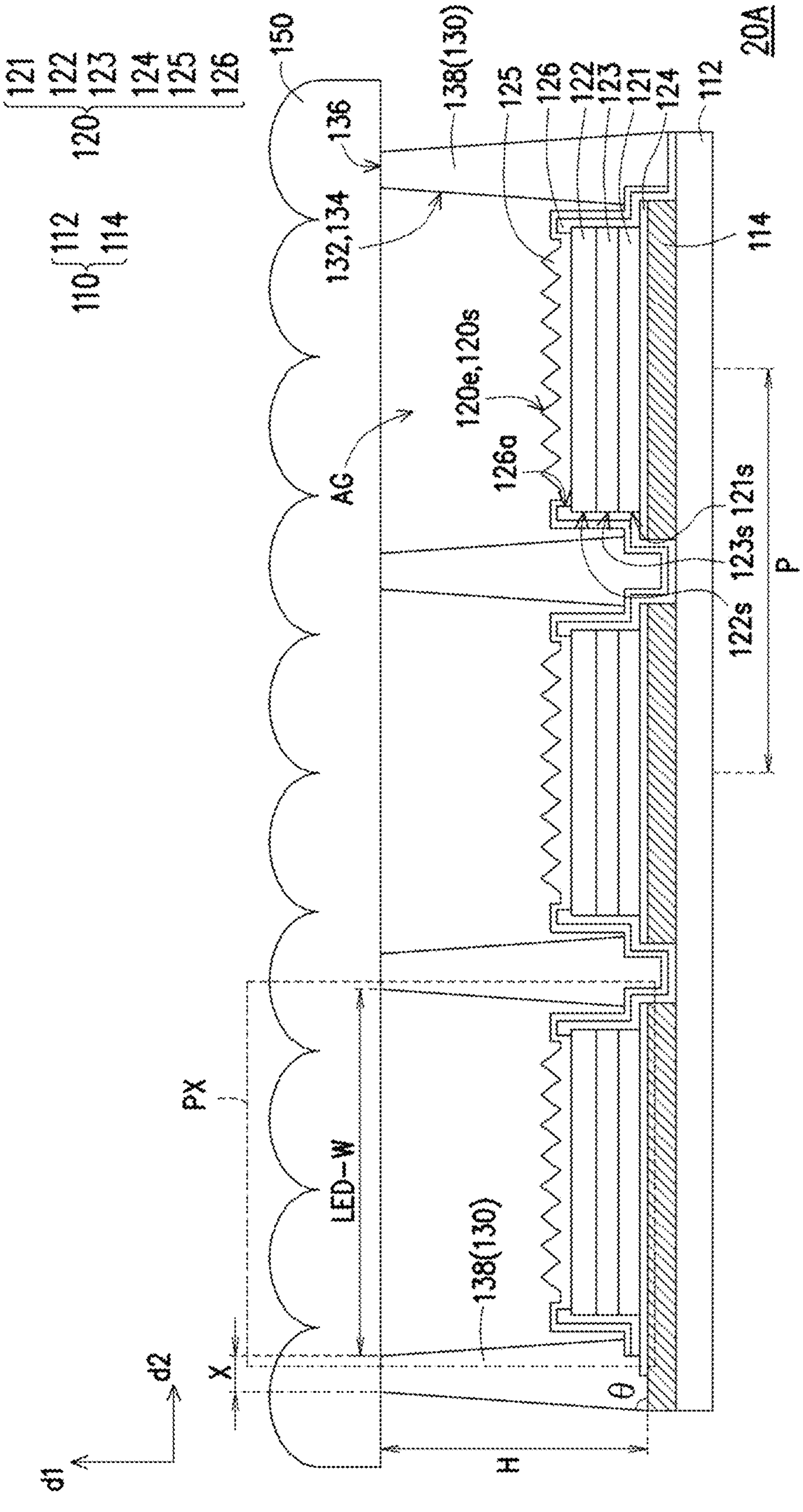
FIG. 9 is a sectional schematic view of a display apparatus according to a second comparative embodiment.

FIG. 9 is a sectional schematic view of a display apparatus according to a second comparative embodiment. The display apparatus 20A in the second comparative embodiment of FIG. 9 is similar to the display apparatus 10A in the second embodiment of FIG. 6, and the difference between the two exists in that the display apparatus 20A in the second comparative embodiment of FIG. 9 does not include the scattering particles 140 of FIG. 6.

Figure 10:
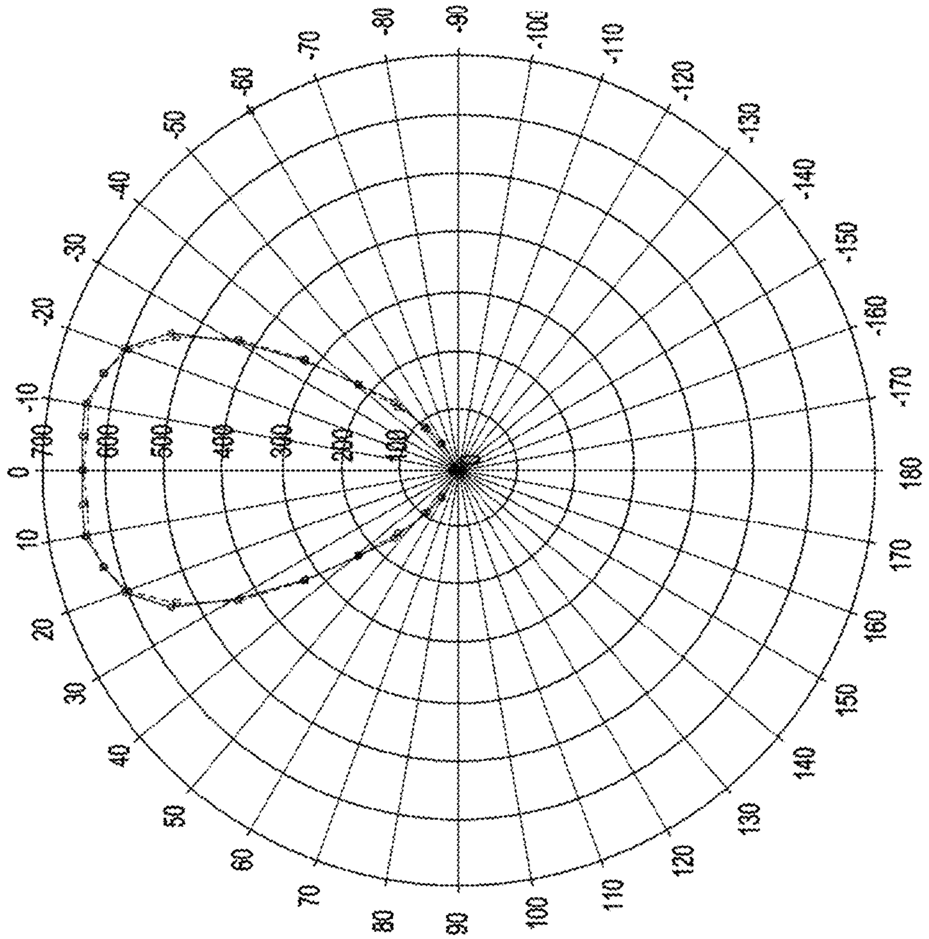
FIG. 10 shows a light emitting angle of a pixel of the display apparatus according to the second comparative embodiment.

FIG. 10 shows a light emitting angle of a pixel of the display apparatus according to the second comparative embodiment. Comparing FIG. 7 and FIG. 10, the display apparatus 10A in the second embodiment of FIG. 6 may significantly reduce the light emitting angle of each pixel PX by the matching of the scattering particles 140 and the oblique surface 134, for example, reducing from 70° of FIG. 10 to 54° of FIG. 7.

Figure 11:
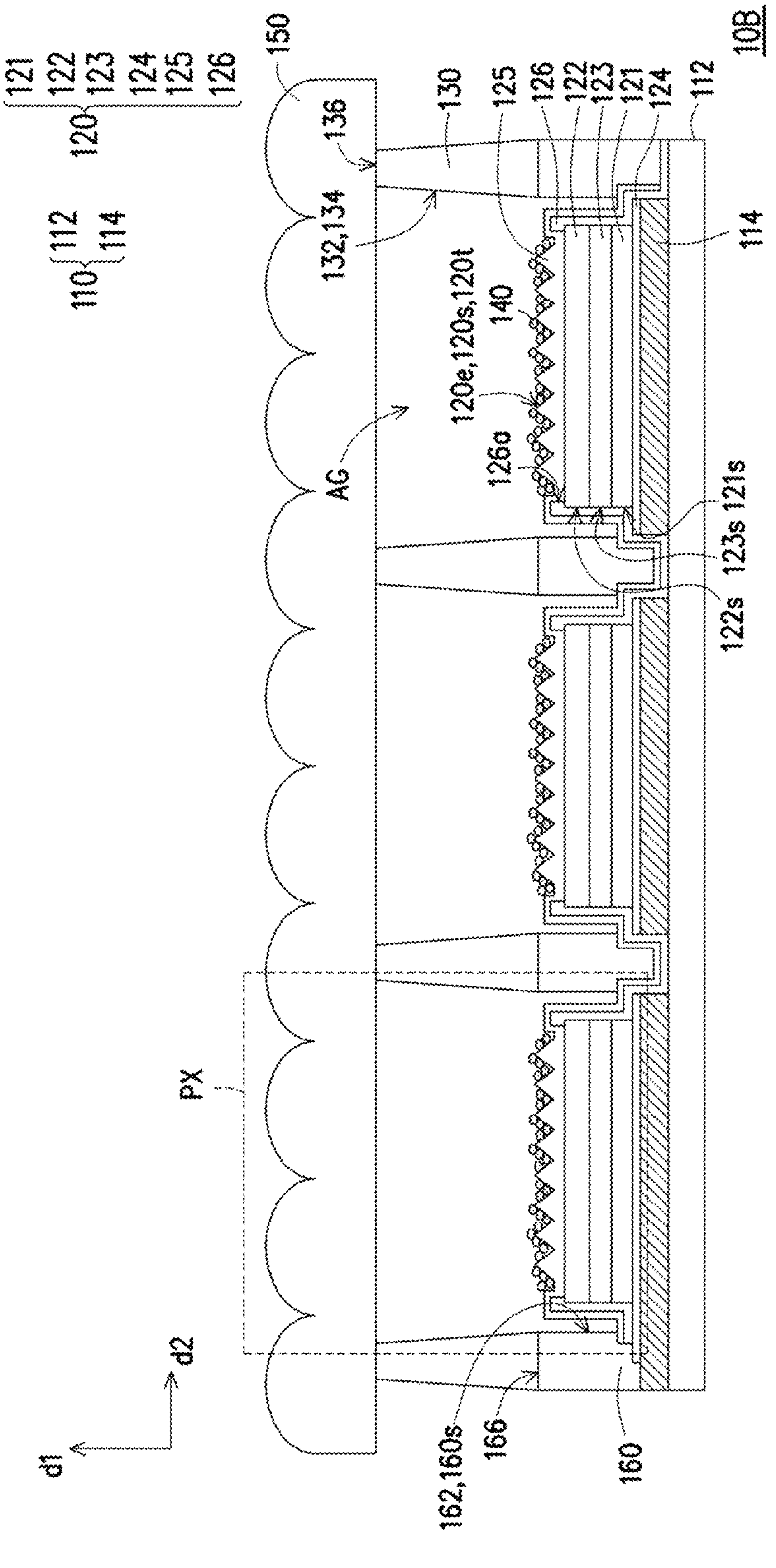
FIG. 11 is a sectional schematic view of a display apparatus according to a third embodiment of the present disclosure.

FIG. 11 is a sectional schematic view of a display apparatus according to a third embodiment of the present disclosure. The display apparatus 10B in the third embodiment of FIG. 11 is similar to the display apparatus 10A in the second embodiment of FIG. 6, and the difference between the two exists in that the display apparatus 10B in the third embodiment of FIG. 11 further includes a second bank layer 160.

Referring to FIG. 11, the display apparatus 10B further includes a second bank layer 160, disposed between the first bank layer 130 and the driving backplane 110. The second bank layer 160 has a plurality of second openings 162, and the second openings 162 of the second bank layer 160 respectively overlap with the first openings 132 of the first bank layer 130. The light emitting components 120 and the scattering particles 140 are disposed in the second openings 162 of the second bank layer 160.

In the present embodiment, the second bank layer 160 has a top surface 166 facing away from the driving backplane 110, and each light emitting component 120 has a top surface 120*t* facing away from the driving backplane 110. The top surface 166 of the second bank layer 160 is substantially coplanar to the top surface 120*t* of each light emitting component 120. In other words, the second bank layer 160 is substantially of the same height as the light emitting components 120. In the present embodiment, a side wall 160*s* of the second bank layer 160 is substantially perpendicular to the driving backplane 110. In one embodiment, the second bank layer 160 may be formed utilizing an electroplating process, and the material of the second bank layer 160 may include a reflective conductive material, but the present disclosure is not limited thereto.

Each pixel PX of the display apparatus 10B includes a light emitting component 120, the scattering particles 140 on the light emitting surfaces 120*e* of the light emitting component 120, the side wall 160*s* of the second bank layer 160 defining a second opening 162, an oblique surface 134 of the first bank layer 130 defining a first opening 132, an air gap AG in the first opening 132 and a portion of the lens component 150 on the first opening 132.

Figure 12:
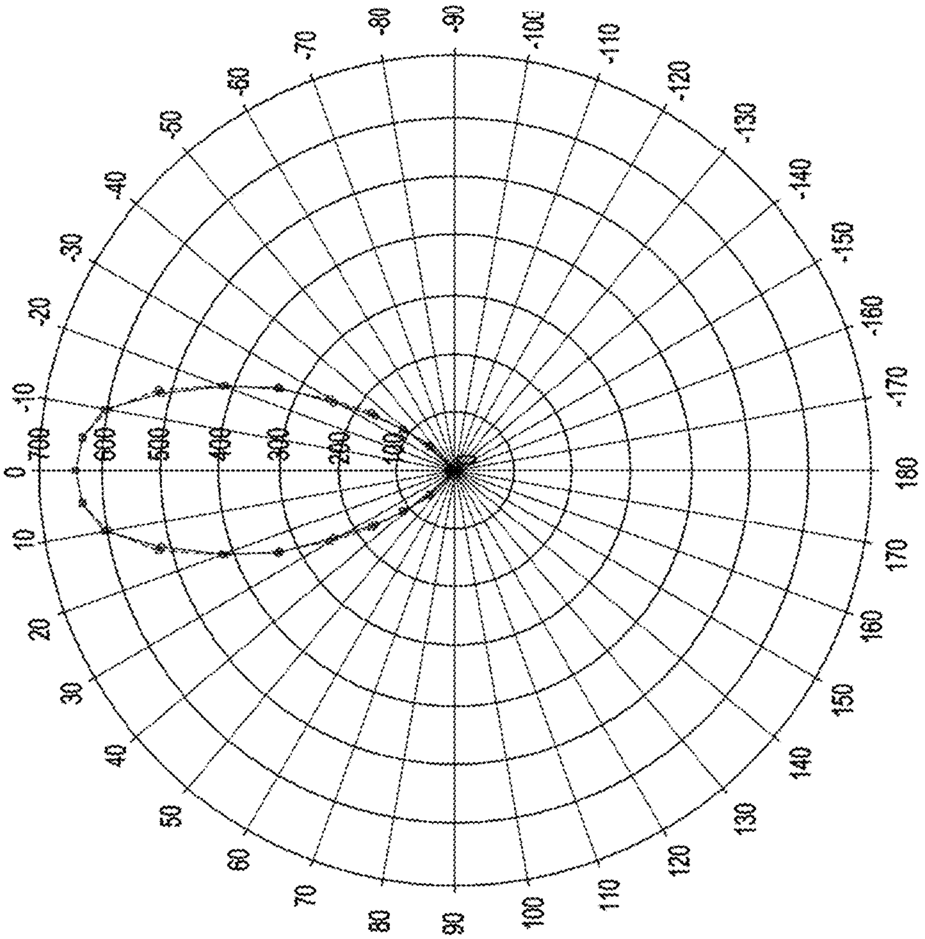
FIG. 12 shows a light emitting angle of a pixel of the display apparatus according to the third embodiment of the present disclosure.

FIG. 12 shows a light emitting angle of a pixel of the display apparatus according to the third embodiment of the present disclosure. Referring to FIG. 11 and FIG. 12, in the present embodiment, the light emitting angle of the pixel PX of the display apparatus 10B may be reduced to 50°.

Figure 13:
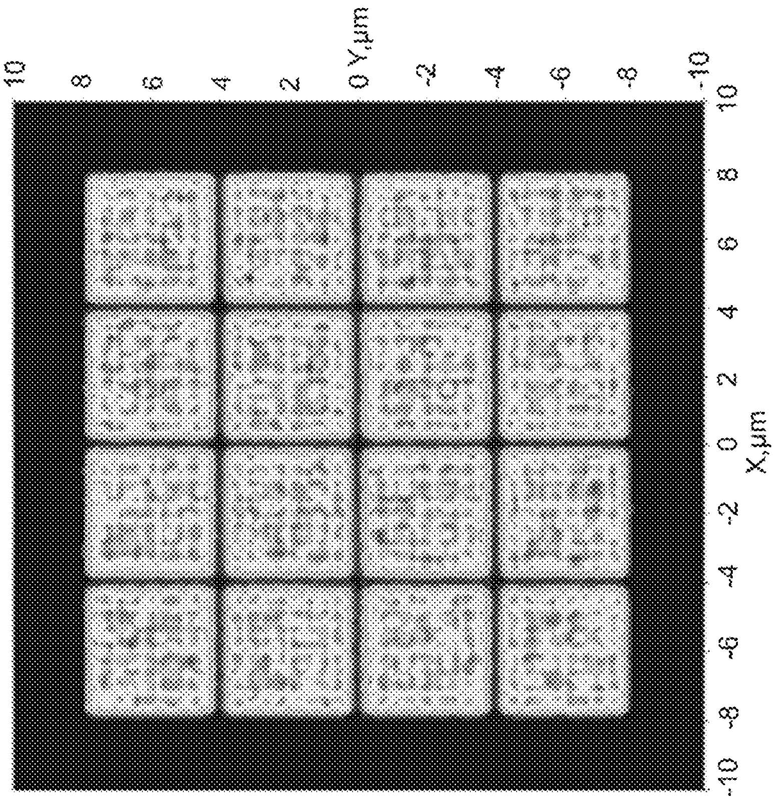
FIG. 13 shows light spots of a plurality of pixels of the display apparatus according to the third embodiment of the present disclosure.

FIG. 13 shows light spots of a plurality of pixels of the display apparatus according to the third embodiment of the present disclosure. Referring to FIG. 11 and FIG. 13, in the present embodiment, the contour of the light spot of each pixel PX of the display apparatus 10B is clear. In other words, the pixels PX are not prone to mix the light, and the display apparatus 10B has good display effect.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A display apparatus, comprising:

a driving backplane;

a plurality of light emitting components, disposed on the driving backplane, and electrically connected to the driving backplane;

a first bank layer, disposed on the driving backplane, wherein the first bank layer has a plurality of first openings and a plurality of oblique surfaces defining the first openings, the light emitting components respectively overlap with the first openings of the first bank layer, and the oblique surfaces of the first bank layer are oblique relative to the driving backplane; and a plurality of scattering particles, disposed on a plurality of light emitting surfaces of the light emitting components, wherein the scattering particles are in direct contact with the light emitting surfaces of the light emitting components, and a plurality of air gaps exist between the scattering particles and the oblique surfaces of the first bank layer.

2. The display apparatus according to claim 1, wherein a refractive index of one of the scattering particles is between a refractive index of one of the air gaps and a refractive index of one of the light emitting components.

3. The display apparatus according to claim 1, wherein a refractive index of one of the scattering particles falls within a range between 1.5 and 2.

4. The display apparatus according to claim 1, wherein a body of the first bank layer has a height in a first direction perpendicular to the driving backplane, the body of the first bank layer has a maximum width in a second direction parallel to the driving backplane, and a ratio of the height to the width is less than or equal to 6.

5. The display apparatus according to claim 4, wherein the light emitting components are arranged at an interval in the second direction, and a width of each of the first openings is less than or equal to the interval.

6. The display apparatus according to claim 1, wherein the light emitting surfaces of the light emitting components respectively include a plurality of rough surfaces, and each of the rough surfaces is provided with a portion of the scattering particles.

7. The display apparatus according to claim 6, wherein each of the light emitting components comprises an electrode, the light emitting surface of each of the light emitting components is formed on the electrode of each of the light emitting components, and the rough surfaces are formed by the electrodes of the light emitting components having structures of an uneven thickness.

8. The display apparatus according to claim 1, further comprising:

a lens component, disposed on the first bank layer, wherein the scattering particles, the oblique surfaces of the first bank layer and the lens component surroundingly form the air gaps.

9. The display apparatus according to claim 8, wherein the lens component is a micro-lens array formed by a plurality of micro-lenses or a lens array formed by a plurality of lenses, and each of the light emitting components corresponds to more than one of the micro-lenses or more than one of the lenses in a first direction perpendicular to the driving backplane.

10. The display apparatus according to claim 1, further comprising:

a second bank layer, disposed between the first bank layer and the driving backplane, wherein the second bank layer has a plurality of second openings, the second openings of the second bank layer respectively overlap with the first openings of the first bank layer, and the light emitting components and the scattering particles are disposed in the second openings of the second bank layer.

11. The display apparatus according to claim 1, wherein each of the light emitting components comprises an electrode, the light emitting surface of each of the light emitting components is formed on the electrode of each of the light emitting components, and the electrodes of two adjacent ones of the light emitting components extend to be connected to each other below a body of the first bank layer along a first direction perpendicular to the driving backplane.

12. The display apparatus according to claim 1, wherein each of the light emitting components comprises:

a first type semiconductor layer;

a second type semiconductor layer;

an active layer, disposed between the first type semiconductor layer and the second type semiconductor layer;

a first electrode, electrically connected to the first type semiconductor layer; and a second electrode electrically connected to the second type semiconductor layer;

wherein the first electrode, the first type semiconductor layer, the active layer, the second type semiconductor layer and the second electrode are stacked sequentially in a first direction perpendicular to the driving backplane; and wherein the light emitting surface of each of the light emitting components is formed on the second electrode of each of the light emitting components, and the scattering particles are in contact with the second electrodes of the light emitting components.

13. The display apparatus according to claim 12, wherein each of the light emitting components further comprises:

an insulating protection layer, covering a side wall of the first type semiconductor layer, a side wall of the second type semiconductor layer and a side wall of the active layer;

wherein the insulating protection layer has a second opening overlapping with the second type semiconductor layer in the first direction, and the second electrode is filled into the second opening of the insulating protection layer to be electrically connected to the second type semiconductor layer.

14. The display apparatus according to claim 13, wherein a portion of the second electrode and a portion of the insulating protection layer extend to be located below a body of the first bank layer along the first direction, and the portion of the second electrode is located between the body of the first bank layer and the portion of the insulating protection layer in the first direction.

15. A display apparatus, comprising:

a driving backplane;

a plurality of light emitting components, disposed on the driving backplane, and electrically connected to the driving backplane;

a first bank layer, disposed on the driving backplane, wherein the first bank layer has a plurality of first openings and a plurality of oblique surfaces defining the first openings, the light emitting components respectively overlap with the first openings of the first bank layer, and the oblique surfaces of the first bank layer are oblique relative to the driving backplane; and a plurality of scattering particles, disposed on a plurality of light emitting surfaces of the light emitting components, wherein a plurality of air gaps exist between the scattering particles and the oblique surfaces of the first bank layer;

wherein the light emitting surfaces of the light emitting components respectively include a plurality of rough surfaces, and each of the rough surfaces is provided with a portion of the scattering particles.

16. The display apparatus according to claim 15, wherein a refractive index of one of the scattering particles is between a refractive index of one of the air gaps and a refractive index of one of the light emitting components.

17. The display apparatus according to claim 15, wherein a refractive index of one of the scattering particles falls within a range between 1.5 and 2.

18. The display apparatus according to claim 15, wherein a body of the first bank layer has a height in a first direction perpendicular to the driving backplane, the body of the first bank layer has a maximum width in a second direction parallel to the driving backplane, and a ratio of the height to the width is less than or equal to 6.

19. The display apparatus according to claim 18, wherein the light emitting components are arranged at an interval in the second direction, and a width of each of the first openings is less than or equal to the interval.

20. The display apparatus according to claim 15, further comprising:

a second bank layer, disposed between the first bank layer and the driving backplane, wherein the second bank layer has a plurality of second openings, the second openings of the second bank layer respectively overlap with the first openings of the first bank layer, and the light emitting components and the scattering particles are disposed in the second openings of the second bank layer.

* * * * *